US011674981B2

(12) United States Patent
Klimczak et al.

(10) Patent No.: US 11,674,981 B2
(45) Date of Patent: Jun. 13, 2023

(54) ARC DETECTOR FOR DETECTING ARCS, PLASMA SYSTEM AND METHOD OF DETECTING ARCS

(71) Applicant: TRUMPF Huettinger Sp. z o. o., Zielonka (PL)

(72) Inventors: Andrzej Klimczak, Warsaw (PL); Konrad Lewandowski, Kobylka (PL); Marcin Golan, Warsaw (PL)

(73) Assignee: TRUMPF HUETTINGER SP. Z O. O., Zielonka (PL)

( * ) Notice: Subject to any disclaimer, the term of this patent is extended or adjusted under 35 U.S.C. 154(b) by 239 days.

(21) Appl. No.: 17/161,768

(22) Filed: Jan. 29, 2021

(65) Prior Publication Data

US 2021/0156893 A1 May 27, 2021

Related U.S. Application Data

(63) Continuation of application No. PCT/EP2019/070372, filed on Jul. 29, 2019.

(30) Foreign Application Priority Data

Aug. 2, 2018 (EP) .................................... 18461597

(51) Int. Cl.
*G01R 19/00* (2006.01)
*G01R 19/165* (2006.01)
(Continued)

(52) U.S. Cl.
CPC ... *G01R 19/0061* (2013.01); *G01R 19/16566* (2013.01); *G01R 27/02* (2013.01);
(Continued)

(58) Field of Classification Search
CPC .......... G01R 19/0061; G01R 19/16566; G01R 27/02; H01J 37/32082; H01J 37/3476; H01J 2237/24564; H01J 2237/332
See application file for complete search history.

(56) References Cited

U.S. PATENT DOCUMENTS 2,905,802 A 9/1959 Roeber
6,703,080 B2 3/2004 Reyzelman et al.
(Continued)

FOREIGN PATENT DOCUMENTS

EP 2174339 A1 4/2010
EP 2202776 B1 2/2012
(Continued)

*Primary Examiner* — Giovanni Astacio-Oquendo
*Assistant Examiner* — Zannatul Ferdous
(74) *Attorney, Agent, or Firm* — Leydig, Voit & Mayer, Ltd.

(57) ABSTRACT

An arc detector for detecting arcs in an RF plasma system includes at least two inputs configured to connect to an RF source, at least one output configured to connect to a plasma load, and a 3 dB coupler connected to the at least two inputs and the at least one output. The arc detector further includes a measuring device configured to measure at least two physical quantities transmitted between the 3 dB coupler and the at least one output, a determinator configured to determine an evaluation quantity based on the at least two physical quantities, and a differentiator configured to differentiate the evaluation quantity. The arc detector additionally includes a comparator configured to compare the output quantity of the differentiator with a reference value indicative of an arc.

22 Claims, 1 Drawing Sheet

(51) Int. Cl.
*G01R 27/02* (2006.01)
*H01J 37/34* (2006.01)
*H01J 37/32* (2006.01)

(52) U.S. Cl.
CPC .... *H01J 37/32082* (2013.01); *H01J 37/3476* (2013.01); *H01J 2237/24564* (2013.01); *H01J 2237/332* (2013.01)

(56) References Cited

U.S. PATENT DOCUMENTS

| | | | |
|---|---|---|---|
| 7,151,422 B2 | 12/2006 | Fritsch et al. | |
| 7,452,443 B2 | 11/2008 | Hintz et al. | |
| 7,477,114 B2 | 1/2009 | Pivit et al. | |
| 8,133,347 B2 | 3/2012 | Hintz et al. | |
| 9,536,713 B2 | 1/2017 | Madsen et al. | |
| 2007/0121267 A1 | 5/2007 | Takei et al. | |
| 2008/0021664 A1* | 1/2008 | Krauss | H01J 37/32935 702/65 |
| 2008/0075640 A1 | 3/2008 | Takeda et al. | |
| 2008/0133154 A1* | 6/2008 | Krauss | H01J 37/32935 702/58 |
| 2009/0160417 A1 | 6/2009 | Klimczak et al. | |
| 2009/0308734 A1* | 12/2009 | Krauss | H01J 37/32935 204/298.03 |
| 2010/0171427 A1 | 7/2010 | Glueck et al. | |
| 2012/0306564 A1 | 12/2012 | Thome et al. | |
| 2013/0038226 A1 | 2/2013 | Labanc | |
| 2014/0159741 A1 | 6/2014 | Bannwarth et al. | |
| 2016/0217975 A1 | 7/2016 | Leypold et al. | |
| 2016/0300695 A1 | 10/2016 | Alt et al. | |
| 2016/0343549 A1 | 11/2016 | Gieraltowski et al. | |
| 2017/0287684 A1 | 10/2017 | Gapiński et al. | |
| 2017/0330737 A1 | 11/2017 | Zelechowski et al. | |
| 2018/0122625 A1 | 5/2018 | Grede et al. | |
| 2018/0123212 A1 | 5/2018 | Alt et al. | |

FOREIGN PATENT DOCUMENTS

| | | |
|---|---|---|
| JP | 2005055190 A | 3/2005 |
| JP | 2009176726 A | 8/2009 |
| JP | 2012050296 A | 3/2012 |
| JP | 2013514753 A | 4/2013 |
| JP | 2014165437 A | 9/2014 |
| JP | 2016540340 A | 12/2016 |
| JP | 2017510938 A | 4/2017 |
| JP | 2017539066 A | 12/2017 |
| JP | 2018504760 A | 2/2018 |
| WO | WO 2009012803 A1 | 1/2009 |

\* cited by examiner

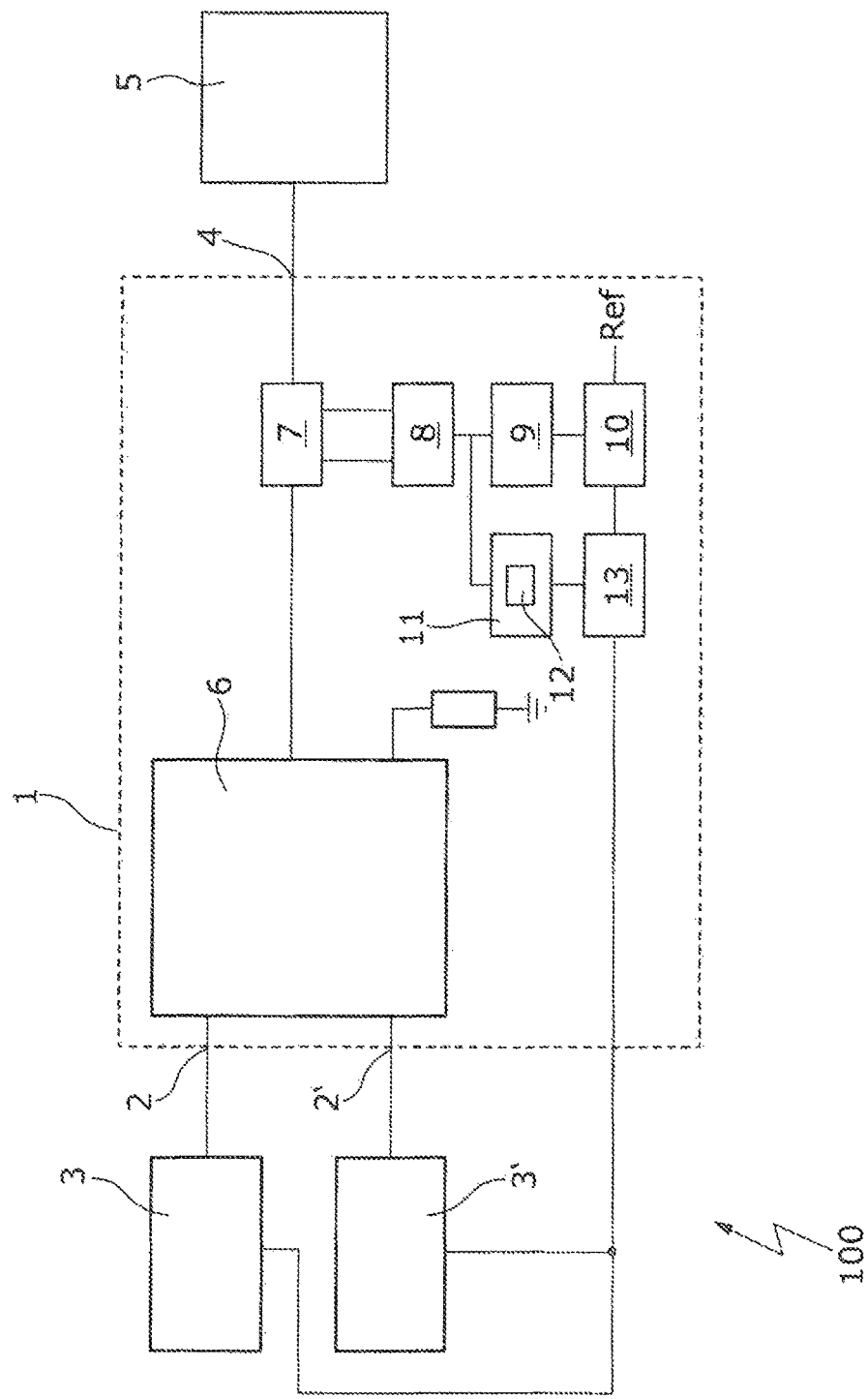

ARC DETECTOR FOR DETECTING ARCS, PLASMA SYSTEM AND METHOD OF DETECTING ARCS

CROSS-REFERENCE TO PRIOR APPLICATIONS

This application is a continuation of International Patent Application No. PCT/EP2019/070372, filed on Jul. 29, 2019, which claims priority to European Patent Application No. 18461597.9, filed on Aug. 2, 2018. The entire disclosure of both applications is hereby incorporated by reference herein.

FIELD

The present disclosure relates to an arc detector for detecting arcs, to a Radio Frequency (RF) plasma system, to a plasma supply system, and to a method of detecting arcs.

BACKGROUND

The coating of substrates, e.g. glass, by cathode sputtering in plasma processes is well known. The sputtering can be done conventionally or using a reactive gas. In that case, it is called reactive sputtering. To that end, a power supply produces a plasma, which removes material from a target, which is then coated on the substrate, e.g. a glass substrate. If a reactive process is used, the target atoms can combine with gas atoms or molecules, depending on the desired coating.

In particular, if reactive processes are being used, arcs can occur in the plasma process. Such arcs can be detrimental to the plasma process and can even destroy the coating. Therefore, it is necessary to detect arcs quickly and reliably. Often, arcs are detected by monitoring the output voltage of the power supply. If there is a rapid fall in the output voltage, an arc is detected. Alternatively, the current can be monitored. If there is an instant rise in the output current, this is also indicative of an arc. In particular, output current and output voltage of the power supply can be monitored and compared with a threshold value, respectively.

Often, when an arc is detected, the power supply is turned off, so the arc is quenched. Turning off the power supply results in lower deposition rates. Therefore, the turn-off of the power should be as short as possible but as long as needed to avoid generation of another arc.

SUMMARY

In an embodiment, the present invention provides an arc detector for detecting arcs in an RF plasma system. The arc detector includes at least two inputs configured to connect to an RF source, at least one output configured to connect to a plasma load, and a 3 dB coupler connected to the at least two inputs and the at least one output. The arc detector further includes a measuring device configured to measure at least two physical quantities transmitted between the 3 dB coupler and the at least one output, a determinator configured to determine an evaluation quantity based on the at least two physical quantities, and a differentiator configured to differentiate the evaluation quantity. The arc detector additionally includes a comparator configured to compare the output quantity of the differentiator with a reference value indicative of an arc.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following:

The FIGURE illustrates a plasma supply system having an arc detector.

DETAILED DESCRIPTION

The present disclosure provides an arc detector, a plasma system having an arc detector, and a method for detecting arcs that are reliable in detecting arcs and that are easy to implement.

In a first aspect, the present disclosure relates to an arc detector for detecting arcs in an RF plasma system. The arc detector includes:
  a. at least two inputs each for connecting to an RF source and at least one output for connecting to a plasma load,
  b. comprising
    i. a 3 dB coupler connected to the inputs and the output,
    ii. a measuring device for measuring at least two physical quantities transmitted between the 3 dB coupler and the output,
    iii. a determinator for determining an evaluation quantity based on the at least two physical quantities;
    iv. a differentiator for differentiating the evaluation quantity,
    v. a comparator for comparing the output quantity of the differentiator with a reference value indicative of an arc.

Using a differentiator is at first sight a disadvantage because arc detection is relatively slow because first the quantities have to be differentiated before an arc can be detected. Hence, using the physical quantities directly, for example, current and voltage, faster arc detection would be possible. Furthermore, a 3 dB coupler has capacitances and inductances, i.e. energy storing components, which might be disadvantageous because after an arc has been detected the supply of power or energy into the plasma should be stopped as quickly as possible, which might be difficult if energy is stored in the components of the 3 dB coupler. However, it turned out that using a 3 dB coupler is advantageous because the output impedance of a 3 dB coupler is a constant value. This makes the measurement of the impedance of the output of the 3 dB coupler much more reliable and dependent on the impedance of the plasma process. Hence, the advantage of using a 3 dB coupler in combination with a differentiator offsets the disadvantages of using a relatively slow arc detection. Using the arc detector according to the invention, arcs can be detected much more reliably, in particular, false arc detection and unnecessary interruption of the plasma process can be avoided.

A 3 dB coupler also called "hybrid coupler" and its behavior in the field of plasma power supplies is described in U.S. Pat. Nos. 7,151,422 B2, 7,477,114 B2, US 2018/0123212 A1, US 2013/0038226 A1, EP 2 202 776 B1, U.S. Pat. No. 8,133,347 B2, e.g., in the meaning of this application a 3 dB coupler behaves as described in these documents.

The measuring device may be configured to measure the quantities at a sampling rate that is higher than the frequency of the RF signals supplied at the inputs. In particular, the sampling rate can be selected to be more than twice as high as the frequency of the RF signals or even more than five times the frequency of the RF signals. By using a high sampling rate, the physical quantities, in particular current and voltage, can be measured with a high resolution. This also improves the reliability of the arc detector.

The output of the 3 dB coupler may have a real output impedance over a power output range from 100 W to 1 kW, in particular a constant real output impedance, in particular a 50 Ohm output impedance. The design of a 3 dB coupler in order to achieve a constant output impedance, in particular an output impedance of 50 Ohm, is for example described in US 2018/0123212 A1.

The measuring device may be a Voltage/Current-probe (V/I-probe). A V/I-probe can be used for measuring voltage and current. The measured current and voltage can be used, for example, to calculate an impedance value as evaluation quantity. The impedance can then be differentiated by the differentiator and the output quantity of the differentiator can be compared with the reference value. If the differentiated impedance falls below a reference value or exceeds a reference value, an arc may be detected.

The determinator may be a phase detector. Hence, the determinator can determine a phase difference between the two measured physical quantities, for example, a phase difference between a measured current and voltage. By further processing the phase difference, also an arc can be detected.

As mentioned above, the determinator can be an impedance detector. In particular, the measured voltage and current can be used to calculate an impedance. However, it is also possible for the determinator to be configured to calculate a reflection factor or another quantity, that can be used for identifying an arc.

Although the arc detector as described above is very reliable in detecting arcs, it is still possible for the phase or impedance derivative to indicate an arc, when there is no arc present in the plasma chamber. Hence, a process monitor may be provided for directly or indirectly monitoring the plasma process. For example, the process monitor can monitor the plasma visually. Alternatively, it is possible to monitor physical quantities transmitted between the 3 dB coupler and the plasma chamber, for example current or voltage.

To this end a process monitor may be provided comprising a tracker for tracking the quantity that is output by the determinator and/or at least one of the physical quantities. For example, the actual impedance value may be tracked all the time in order to not detect a false arc when a process or a layer in the process changes rapidly. Such a change could also lead to a fast change in impedance or phase difference. However, if this happens, no arc should be detected.

An arc detection signal generator may be provided that is connected to the comparator and the process monitor and that is configured to output an arc detection signal if the output quantity of the differentiator passes the reference value and the process monitor does not indicate a process change. If such an arc detection signal is generated, the power output of the RF sources can be stopped in order to avoid further supplying energy into the plasma process. However, the power supply should only be interrupted, if there really is an arc in the plasma. Therefore, it is important to avoid false detection of arcs.

Very fast arc detection is possible, if at least the determinator, the differentiator and the comparator are embedded in a logic circuit, in particular a Field-Programmable Gate Array (FPGA).

Hence, the data processing can be effected very quickly and therefore an arc can be detected quickly.

According to a further aspect, the present disclosure relates to a plasma supply system. The plasma supply system includes:
a. an arc detector as described herein,
b. two RF sources connected to the inputs of the arc detector,
c. a load, in particular a plasma load, connected to the output of the arc detector.

Such a system can be used for producing high quality plasma deposited layers. In particular, the interruption of the plasma process due to false arc detection can be minimized.

According to a further aspect, the present disclosure relates to the use of an arc detector as described herein in a plasma supply system for detecting arcs in a plasma load.

According to a further aspect, the present disclosure relates to a method of detecting arcs in a system having a 3 dB coupler and a plasma load, wherein the plasma load is supplied with an RF signal. The method includes the steps of:
a. measuring at least two physical quantities between the 3 dB coupler and the plasma load;
b. determining an evaluation quantity based on the at least two physical quantities,
c. differentiating with respect to time of the evaluation quantity,
d. comparing the differentiated quantity with the reference value indicative of an arc.

Such a method is very reliable in detecting arcs and in particular in avoiding false arc detection. Furthermore, the method can be implemented relatively cheaply in an arc detector, since the cost for impedance matching can be kept very low due to the constant output impedance of the 3 dB coupler.

The differentiated quantity and/or the physical quantities can be monitored. Thus, the plasma process can be monitored all the time. By doing this, false arc detection can be avoided because it can be detected if a rapid impedance change or change in phase difference between two physical quantities is due to a process change or due to an arc.

The physical quantities can be sampled at a rate higher than the frequency of the RF power signal. Thus, the physical quantities can be sampled at a very high frequency, resulting in a high resolution, which makes arc detection more reliable.

The FIGURE illustrates a plasma supply system 100, having an arc detector 1. The arc detector 1 has two inputs 2, 2', which are each connected to an RF source 3, 3'.

The arc detector 1 further has an output 4, that is connected to a load, in particular a plasma load, more particularly to a plasma process.

The arc detector 1 comprises a 3 dB coupler 6, which is connected to the inputs 2, 2' and thus to the RF sources 3, 3'. The output of the 3 dB coupler 6 has a constant real impedance of 50 Ohm. Between the 3 dB coupler 6 and the load 5 a measuring device 7 is provided for measuring physical quantities transmitted between the 3 dB coupler 6 and the load 5. The measuring device may for example be embodied as a I/V-probe.

The measured physical quantities are fed to a determinator 8, which is connected to the measuring device 7. The determinator 8 determines an evaluation quantity based on the at least two physical quantities measured by the measuring device 7. For example, the determinator determines an impedance or a phase difference.

The determinator 8 is connected to a differentiator 9 for differentiating the evaluation quantity determined by the determinator 8 with respect of time. The derivative is delivered to a comparator 10 for comparing the output quantity of the differentiator 9 with a reference value Ref indicative of an arc.

The output of the determinator 8 is also fed to a process monitor 11 which comprises a tracker 12 for tracking for example an impedance determined by the determinator 8. The output of the tracker 12 is delivered to a detection signal generator 13, which is also provided with the output signal of the comparator 10. Only if the output signal of the comparator 10 indicates an arc and the output of the process monitor 11 indicates that there is no significant change in the plasma process, an arc is detected, i.e. an arc detection signal is generated. This signal is then fed to the RF sources 3, 3' and can lead to a shut-down of the RF sources.

Hence, no further power is delivered to the plasma process, such that an arc is extinguished.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. An arc detector for detecting arcs in a Radio Frequency (RF) plasma system, the arc detector comprising: at least two inputs, each respective input configured to connect to a respective RF source; at least one output configured to connect to a plasma load, a 3 dB coupler connected to the at least two inputs and the at least one output, a measuring device configured to measure at least two physical quantities transmitted between the 3 dB coupler and the at least one output, a determinator configured to determine an evaluation quantity based on the at least two physical quantities, a differentiator configured to differentiate the evaluation quantity, and a comparator configured to compare the output quantity of the differentiator with a reference value indicative of an arc.

2. The arc detector according to claim 1, wherein the measuring device is configured to measure the quantities at a sampling rate that is higher than the frequency of RF signals supplied at the at least two inputs.

3. The arc detector according to claim 2, wherein the measuring device is configured to measure the quantities at a sampling rate that is more than twice as high as the frequency of the RF signals.

4. The arc detector according to claim 3, wherein the measuring device is configured to measure the at least two physical quantities at a sampling rate that is more than five times as high as the frequency of the RF signals.

5. The arc detector according to claim 1, wherein the at least one output has a real output impedance over a power output range from 100 Watt (W) to 1 Kilo Watt (KW).

6. The arc detector according to claim 5, wherein the real output impedance is a constant real output impedance over the power output range from 100 Watt (W) to 1 Kilo Watt (KW).

7. The arc detector according to claim 1, wherein the measuring devices is a Voltage/Current-probe (V/I-probe) for measuring voltage and current.

8. The arc detector according to claim 7, wherein the arc detector is configured to calculate an impedance value from measured current and voltage.

9. The arc detector according to claim 8, wherein the arc detector is configured to differentiate the impedance by the differentiator and to compare the output quantity of the differentiator with the reference value.

10. The arc detector according to claim 9, wherein the arc detector is configured to detect an arc if the differentiated impedance falls below the reference value or exceeds the reference value.

11. The arc detector according to claim 1, wherein the determinator is a phase detector.

12. The arc detector according to claim 1, wherein the determinator is an impedance detector.

13. The arc detector according to claim 1, further comprising a process monitor configured to directly or indirectly monitor the plasma process.

14. The arc detector according to claim 13, wherein the process monitor comprises a tracker configured to track the quantity output by the determinator and/or at least one of the physical quantities.

15. The arc detector according to claim 13, further comprising an arc detection signal generator connected to the comparator and the process monitor, the arc detection signal generator being configured to output an arc detection signal if the output quantity of the differentiator passes the reference value and the process monitor does not indicate a process change.

16. The arc detector according to claim 1, wherein at least the determinator, the differentiator and the comparator are embedded in a logic circuit.

17. The arc detector according to claim 16, wherein the logic circuit is a Field-Programmable Gate Array (FPGA) logic circuit.

18. A plasma supply system comprising:
an arc detector according to claim 1,
two RF sources connected to the at least two inputs of the arc detector, and
a plasma load connected to the at least one output of the arc detector.

19. A use of an arc detector according to claim 1 in a plasma supply system for detecting arcs in the plasma load.

20. A method of detecting arcs in a system having a 3 dB coupler and a plasma load, wherein the plasma load is supplied with a Radio Frequency (RF) power signal, the method comprising: measuring at least two physical quantities between the 3 dB coupler and the plasma load; determining an evaluation quantity based on the at least two physical quantities; differentiating the evaluation quantity with respect to time; and comparing the differentiated quantity with a reference value indicative of an arc.

21. The method according to claim 20, wherein the differentiated quantity and/or the at least two physical quantities are monitored.

22. The method according to claim 20, wherein the physical quantities are sampled at a rate higher than the frequency of the RF power signal.

\* \* \* \* \*